(12) United States Patent
Kono et al.

(10) Patent No.: US 6,822,310 B2
(45) Date of Patent: Nov. 23, 2004

(54) SEMICONDUCTOR INTEGRATED CIRCUIT

(75) Inventors: Kazushi Kono, Tokyo (JP); Takeshi Iwamoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 33 days.

(21) Appl. No.: 10/424,129

(22) Filed: Apr. 28, 2003

(65) Prior Publication Data

US 2004/0007777 A1 Jan. 15, 2004

(30) Foreign Application Priority Data

Jul. 10, 2002 (JP) .......................................... 2002-200846
Feb. 26, 2003 (JP) .......................................... 2003-049295

(51) Int. Cl.[7] .............................................. H01L 29/00
(52) U.S. Cl. ........................ 257/529; 257/209; 257/530
(58) Field of Search ................................. 257/529, 209, 257/530

(56) References Cited

U.S. PATENT DOCUMENTS 4,826,785 A * 5/1989 McClure et al. ................ 438/6
6,362,514 B1    3/2002 Ido et al.
6,703,680 B2 * 3/2004 Toyoshima .................. 257/529

FOREIGN PATENT DOCUMENTS

| JP | 11-297835 | 10/1999 |
| JP | 2000-58654 | 2/2000 |
| JP | 2000-208635 | 7/2000 |
| JP | 2002-76129 | 3/2002 |

OTHER PUBLICATIONS

Nikkei Microdevices, "Case Study (2): Wiring," pp. 62–67, No. 4, Apr. 2000 (with brief description).

* cited by examiner

*Primary Examiner*—Phat X. Cao
*Assistant Examiner*—Theresa T. Doan
(74) *Attorney, Agent, or Firm*—Burns, Doane, Swecker & Mathis, L.L.P.

(57) ABSTRACT

A semiconductor integrated circuit according to the invention includes a wiring member formed on a main face of a semiconductor substrate, a fusing member connected to the wiring member and having a predetermined thickness, a barrier member for covering a bottom face and a side face of the fusing member, a light absorbing member for covering at least a side face portion of the barrier member for covering the fusing member, and an insulating member for embedding the wiring member, the fusing member, the barrier member and the light absorbing member. A complex permittivity of the light absorbing member is provided with a real part smaller than that of the fusing member in absolute value and an imaginary part larger than that of the fusing member.

16 Claims, 10 Drawing Sheets

|  | COMPLEX REFRACTIVE CONSTANT | | COMPLEX PERMITTIVITY | |
| --- | --- | --- | --- | --- |
|  | n | k | $\varepsilon_R$ | $\varepsilon_i$ |
| Cu | 0.161 | 6.212 | −38.563 | 2.000 |
| Ta | 3.088 | 4.134 | −7.554 | 25.532 |
| TaN | 4.884 | 3.912 | 8.550 | 38.212 |
| Ti | 2.569 | 2.468 | 0.509 | 12.681 |
| TiN | 2.015 | 3.600 | −8.900 | 14.508 |

WAVELENGTH: 1.047 μm

| WAVELENGTH (μm) | MEMBER | ABSORPTION EFFICIENCY MAXIMIZING FILM THICKNESS (nm) |
|---|---|---|
| 1.047 | Ta | 40 |
| | TaN | 25 |
| | Ti | 70 |
| | TiN | 80 |
| 1.321 | Ta | 50 |
| | TaN | 35 |
| | Ti | 90 |
| | TiN | 60 |

Fig.13A  *PRIOR ART*
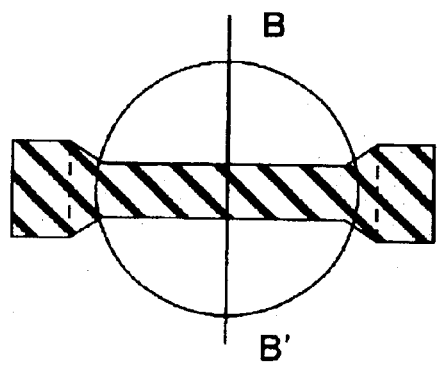
Fig.13B  *PRIOR ART*
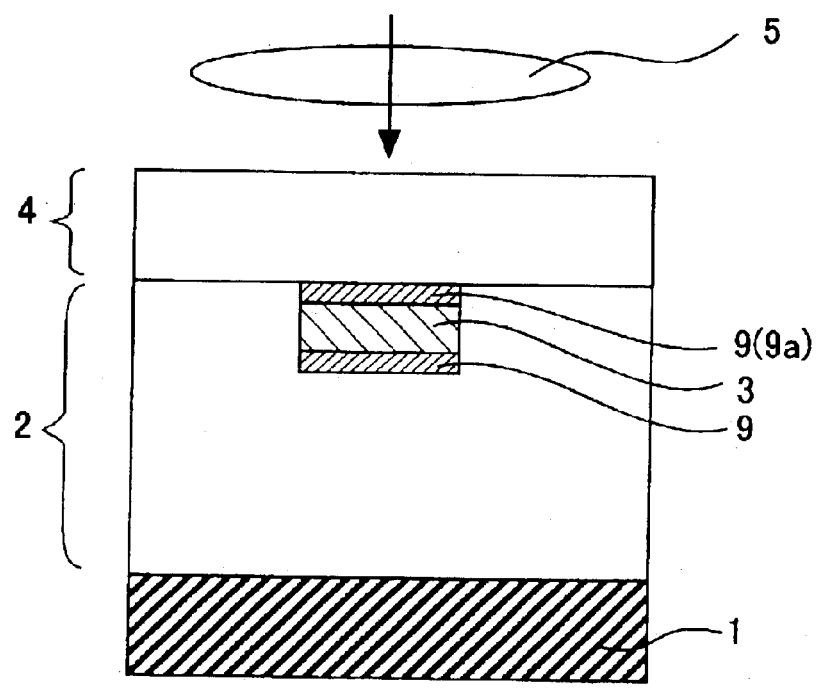

SEMICONDUCTOR INTEGRATED CIRCUIT

BACKGROUND OF THE INVENTION

1. Field of the Invention

The present invention relates to a semiconductor integrated circuit, particularly to a semiconductor integrated circuit having a fuse which can be blown out by light irradiation.

2. Description of the Related Art

Recently the number of elements in a semiconductor integrated circuit represented by DRAM (Dynamic Random Access Memory) or SRAM (Static Random Access Memory) is remarkably increasing and an unexpected defect in fabrication steps deteriorates the yield inevitably. To overcome the defect, those methods have been put into practice in which a redundant circuit is provided in a chip circuit and a defective memory cell in a main memory is replaced with a spare memory cell to make the whole chip circuit acceptable. One of the methods is laser blowing.

Laser blowing generally uses a fuse as an element for switching a main memory to a spare memory cell. FIG. 13A is a top view of a conventional fuse whose major constituent is aluminum and FIG. 13B shows a section B–B' thereof.

Referring to the drawings, numeral 2 designates an interlayer insulating film disposed between a metal member 3 and a silicon substrate 1, numeral 4 designates a passivation film arranged above the metal member 3 and those insulating films are formed of silicon oxide or silicon nitride. The metal member 3 is comprised of aluminum or copper and an upper face and a lower face thereof are covered by barrier metal layers 9 (the upper portion functions as an anti-reflection coating) comprising Ti, TiN or the like. A fuse includes the metal member 3 and the barrier metal layers 9.

In general laser blowing uses a laser beam with a wavelength of 1.0 $\mu$m to 1.4 $\mu$m in infrared region. When the metal member 3 is irradiated with a laser beam 5, the energy of the laser beam 5 is mainly absorbed by the barrier metal member 9a (anti-reflection coating) covering the upper face of the metal member 3 from among the barrier metal layers 9 covering the upper and lower faces thereof. Absorption of the laser beam 5 rapidly elevates the temperature of the barrier metal member 9a and the metal member 3 warms up by conductive heat from the barrier metal layer 9.

When the metal member 3 heats up and changes rapidly its state from a solid to a gas via a liquid, a change of pressure occurring quickly at this occasion blows off the passivation film 4. Simultaneously, the metal member 3 is blown out and a blow phenomenon completes itself. The details of the blow phenomenon of the metal member 3 are described in Japanese Patent Laid-Open No. 208635/2000.

Now, speedy driving and single chip system are required in a semiconductor integrated circuit, and then lower resistance of a wiring member in use and multilayering of a chip have been in progress. From a view point of the lower resistance of the wiring, a copper wiring has been put into practice in place of an aluminum wiring of the conventional art. The change in the material and the structure of the semiconductor integrated circuit affects laser blowing and the following points are necessary to be mentioned.

In accordance with the multilayering of the chip, it is requested that the fuse is formed at a wiring layer disposed at as upper as possible. To perform narrowing of a wiring pitch and speed up of an operational frequency at the same time, the formation of a lower resistance becomes indispensable for the wiring layer disposed at upper layers of the chip. As a result, a thicker layer is used for the wiring layer.

Using the wiring layer disposed at the upper layer as the fuse layer, then, signifies not only a change in the fuse material to copper but also the thicker film of the fuse. The thicker film of the fuse reduces the transmission efficiency of the laser beam to the fuse to thereby make laser blowing more difficult.

Meanwhile, a copper fuse formed by a Damascene process, for example, not like a fuse formed of aluminum wiring layer, has a structure in which three faces (two side faces and bottom face) of the copper member is covered by barrier metal layers convenience of the process. That is, in the case of the normal copper fuse, the barrier metal member 9a is not formed at the upper face of the metal member 3.

Therefore, in the case of the copper fuse of the related art, laser beam irradiated for laser blowing is reflected almost wholly by copper at the surface of the fuse. As far as laser beam having the wavelength of infrared region is used, it is difficult to firmly carry out laser blowing.

SUMMARY OF THE INVENTION

The invention has been carried out in order to overcome the above-described problems and it is an object thereof to provide a semiconductor integrated circuit having a fuse which can be firmly blown out by laser beam with a wavelength of an infrared region, even when a copper wiring layer disposed at an upper stage of the chip is used as a fuse layer.

According to an aspect of the invention, there is provided a semiconductor integrated circuit comprising a wiring member formed on a main face of a semiconductor substrate, a fusing member connected to the wiring member and having a predetermined thickness, a light absorbing member for covering a bottom face and a side face of the fusing member, and an insulating member for embedding the fusing member and the light absorbing member therein, wherein a complex permittivity of the light absorbing member is provided with a real part smaller than that of the fusing member in absolute value and an imaginary part larger than that of the fusing member.

Further, according to another aspect of the invention, there is provided a semiconductor integrated circuit comprising a wiring member formed on a main face of a semiconductor substrate, a fusing member connected to the wiring member and having a predetermined thickness, a barrier member for covering a bottom face and a side face of the fusing member, a light absorbing member for covering at least a side face portion of the barrier member for covering the fusing member, and an insulating member for embedding the wiring member, the fusing member, the barrier member and the light absorbing member therein, wherein a complex permittivity of the light absorbing member is provided with a real part smaller than that of the fusing member in absolute value and an imaginary part larger than that of the fusing member.

BRIEF DESCRIPTION OF THE DRAWINGS

FIG. 1A is a sectional view and FIG. 1B is a top view of the fuse;

FIG. 7A shows a case in which laser beam having an electric field vector in parallel with a longitudinal direction of a metal member is incident and FIG. 7B shows a case in which laser beam orthogonal thereto is incident;

FIGS. 13A and 13B are views for explaining a constitution of a fuse of a related art.

DETAILED DESCRIPTION OF THE PREFERRED EMBODIMENTS

The reflectance of copper with regard to light of an infrared region is as high as 98% or more (the reflectance of aluminum in the same wavelength region is about 97%), and then the present invention provides a light absorbing member which absorbs laser beam efficiently. Although according to embodiments of the invention, a copper fuse is blown out by using laser beam in the infrared region, the invention is applicable also to a fuse of aluminum, tungsten or the like.

Figure 1A:
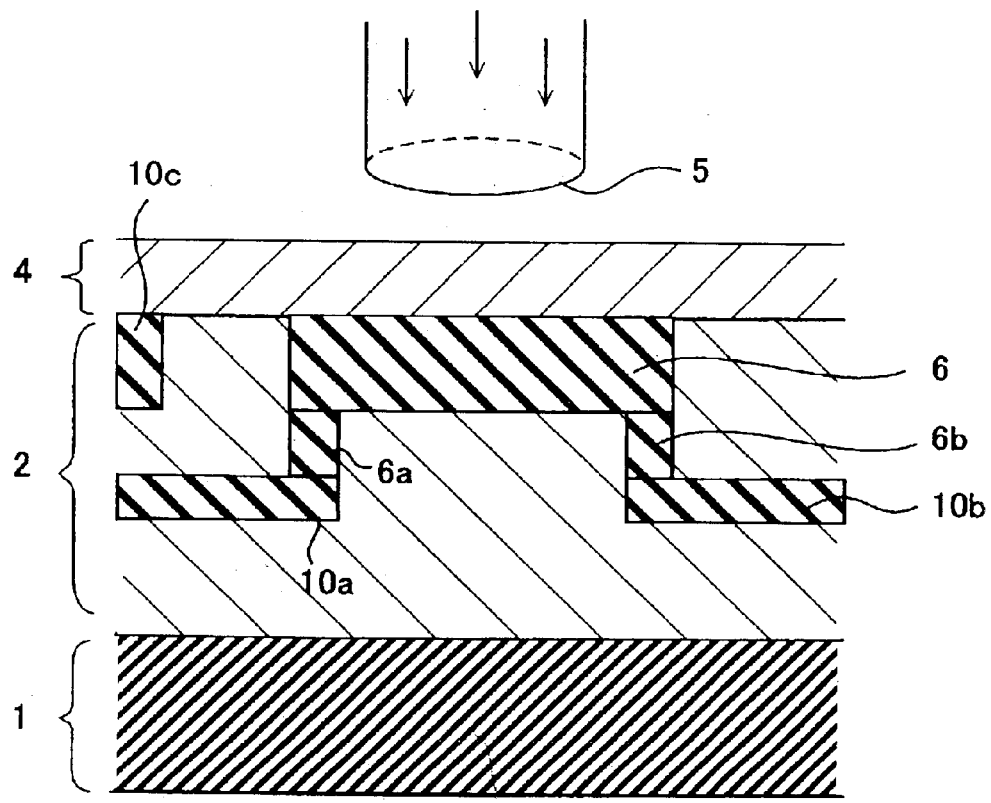
FIGS. 1A and 1B are views for explaining a total constitution of a fuse according to the invention.
Figure 1B:
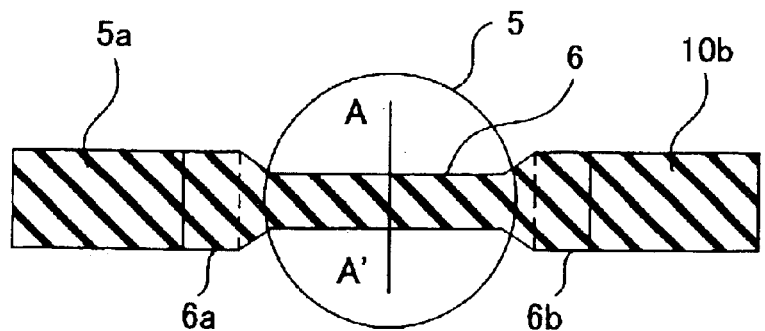

FIG. 1A is a sectional view illustrating a fuse according to the invention from a side direction and FIG. 1B shows a view illustrating the same region from the top. Referring to the drawings, numeral 2 designates an interlayer insulating film (first insulating film) formed on a main face (a face on which a circuit or the like is formed) of a silicon (semiconductor) substrate 1. Although the interlayer insulating film 2 is drawn as if it were a single layer, an actual interlayer insulating film 2 is laminated by a number of layers along with wirings. Though a metal layer (fusing member) 6 is formed at the same stage as that of a wiring 10c provided at an uppermost layer, the metal member 6 may be provided at a stage lower than the uppermost layer, for convenience of the circuit.

Wirings 10a and 10b are disposed at a layer lower than the metal member 6 by one stage and connected to the metal member 6 via conductive plugs 6a and 6b. When the metal member 6 is blown out by laser beam 5, conduction between the wiring 10a and the wiring 10b is cut off and a main memory is switched to a spare memory cell. A passivation film (second insulating film) 4 is in contact with an upper face of the metal member 6 and provided at an uppermost surface to protect the circuit including the wirings.

Figures 2, 3:
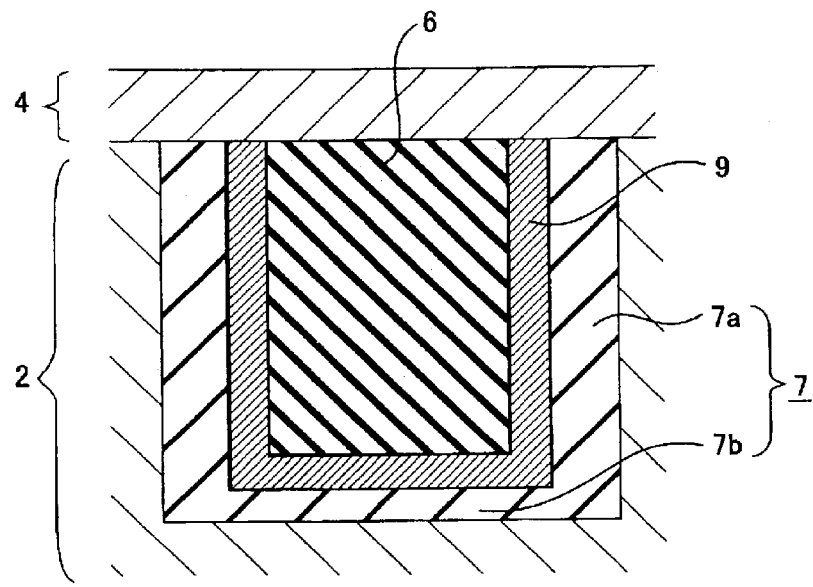
FIG. 2 is a sectional view for explaining the constitution of the fuse according to the invention.
FIG. 3 is a table showing complex refractive indices and complex permittivities of materials suitable for an absorbing layer.

FIG. 2 is a view for explaining a constitution of the fuse whose major constituent is copper and corresponds to a section A–A' in FIG. 1B. In order to restrain reaction with the interlayer insulating film 2, the metal member 6, of 1 μm thickness or so, is provided with barrier metal layers 9 (for example, TaN or the like) having a film thickness of about 20 nm on three faces (two side faces and a bottom face) thereof. A metal layer (Ta or the like, not illustrated) having a thickness of about 15 nm may also be provided inside the barrier metal layer 9 in order to get better adhesion to the metal member 6. An absorbing layer 7 including side wall portion 7a and a bottom portion 7b is provided on an outer side of the barrier metal layer 9. The fuse includes the metal member 6, the barrier metal layer 9 and the absorbing member 7.

The absorbing layer 7 comprises a material which absorbs efficiently the laser beam 5 of the infrared region for laser blowing. It is not necessary that the side wall portion 7a and the bottom portion 7b are of the same thickness, or rather, it is preferable that the bottom portion 7b is thinner than the side wall portion 7a to reduce a residue by laser blowing (refer to FIG. 2). In an extreme case, the thickness of the bottom portion 7b may be zero.

This is because absorption of the laser beam at the bottom portion 7b is much smaller than that of the side wall portion 7a, and then, the bottom portion 7b of the absorbing layer 7 is heated and blown out during laser irradiation by conductive heat from the side wall portion 7a and conductive heat from the metal member 6. The absorbing layer 7 (bottom portion 7b) provided at the lower portion of the fuse may be of minimum film thickness necessarily for forming wirings.

The film thickness of the metal member 6 is the same as the film thickness of the wiring 10c disposed on the same stage as shown by FIG. 1A. This is for making fabrication of the fuse advantageous in view of cost and in view of processing, by using a wiring structure of the same stage as a fuse layer. However, when the wiring is further thickened in the future, it is anticipated that the laser blowing becomes impossible physically and therefore, it is preferable to make the fuse thinner than the wiring portion of the same stage.

A characteristic of the absorbing layer 7 will be explained below. Considering the fact that light is an electromagnetic wave, absorption of light by a substance is related to a complex permittivity $\epsilon$ of the substance, which is represented by the equation below including a real part $\epsilon_R$ and an imaginary part $\epsilon_i$.

$\epsilon = \epsilon_R - i\epsilon_i$ (i denotes the unit imaginary number)

The following relationships are established between the real part $\epsilon_R$ and the imaginary part i of the complex permittivity, where notation n designates a refractive index of the substance and notation k designates an extinction coefficient.

$\epsilon_R = n^2 - k^2$ $\epsilon_i = 2nk$

Absolute values of the real part $\epsilon_R$ and the imaginary part $\epsilon_i$ of the complex permittivity represent respectively easiness of incidence of light to a substance and a degree by which incident light is absorbed in the substance. It is necessary that the absolute value of the real part $\epsilon_R$ of the absorbing layer 7 is smaller than the absolute value of the real part $\epsilon_R$ of the metal member 6, and the imaginary part $\epsilon_i$ of the complex permittivity of the absorbing layer 7 is larger than the imaginary part $\epsilon_i$ of the complex permittivity of the metal member 6.

FIG. 3 shows complex refractive indices and complex permittivies of tantalum, tantalum nitride, titanium and titanium nitride when the wavelength is 1047 nm. Compared with values for copper shown in the diagram, it is understood that all four kinds of materials describe-above satisfy the above-mentioned conditions. Other examples of the material include tungsten nitride (WN) or the like.

Figures 4, 5:
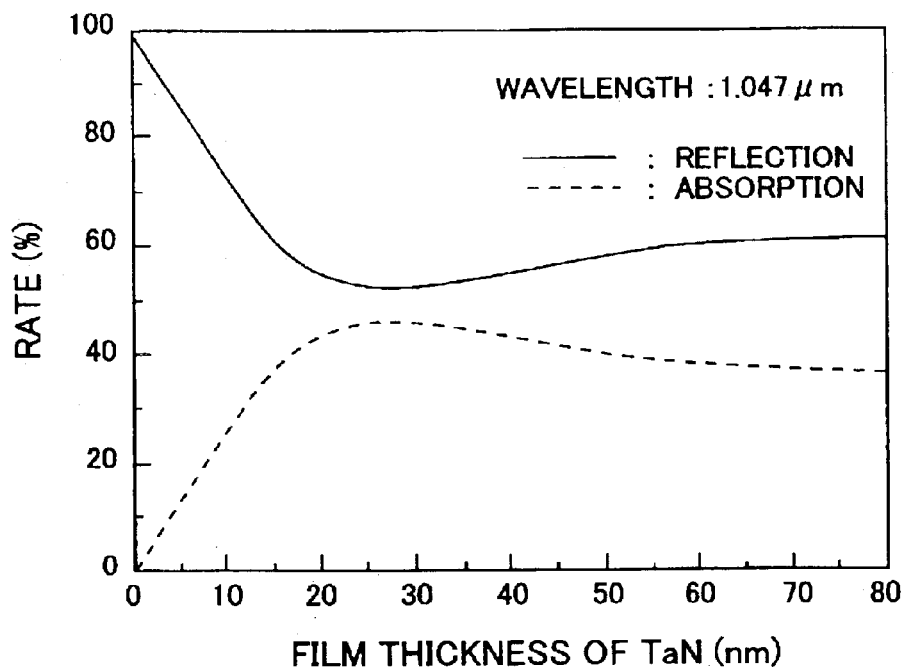
FIG. 4 is a diagram for explaining a relationship between an absorption rate and a reflectance of a tantalum nitride with regard to laser beam having a wavelength of 1.047 μm (1047 nm)
FIG. 5 is a diagram for explaining a relationship between light absorption efficiency maximizing film thicknesses (nm) and wavelengths of various materials.

Although the absorbing layer 7 needs a certain degree of thickness in order to absorb the laser beam efficiently, laser blowing is liable to fail when the absorbing layer 7 exceeds a minimal thickness. FIG. 4 shows an exemplary relationship between an absorption efficiency of laser beam having the wavelength of 1.047 $\mu$m (1047 nm) and the film thickness of the absorbing layer 7 formed of tantalum nitride (TaN). The diagram is calculated by utilizing a laminated infinite parallel plane model.

The diagram illustrates that when laser beam is incident on the tantalum nitride, the energy absorption efficiency becomes saturated at the film thickness of the tantalum nitride equal to or more than about 25 nm. Such a film thickness is referred to as an absorption efficiency maximizing film thickness.

That is, while considering the case where the tantalum nitride having the film thickness equal to or larger than 25 nm is irradiated by laser for a given period of time, the volume of an object to be blown out by laser increases more largely than an increase in incident energy, and then the probability of failing in laser blowing becomes higher. Accordingly, it is preferable that the film thickness of the absorbing layer 7 falls in a range of 50% to 300% of the light absorption efficiency maximizing film thickness and further preferable when the film thickness falls in a range of 50% to 200% thereof. Absorption efficiency maximizing film thicknesses of respective substances obtained by a calculation are shown in FIG. 5.

Figure 6A:
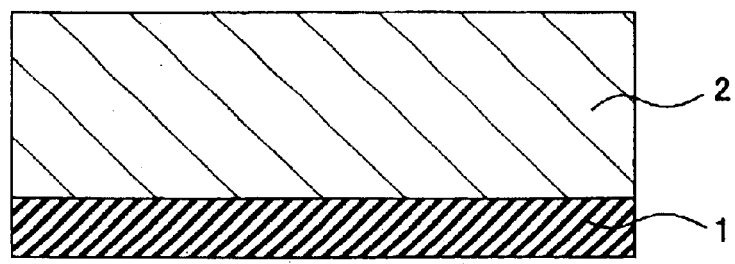
FIGS. 6A, 6B, 6C and 6D are views for explaining a method of forming a fuse according to the invention.
Figure 6B:
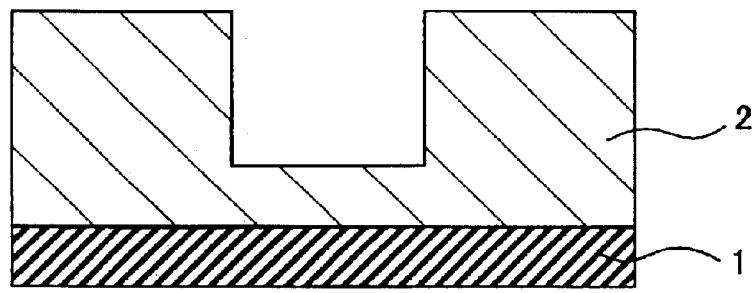
Figure 6C:
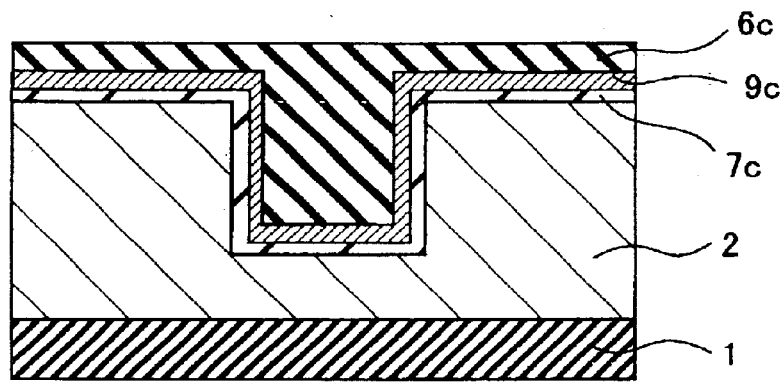
Figure 6D:
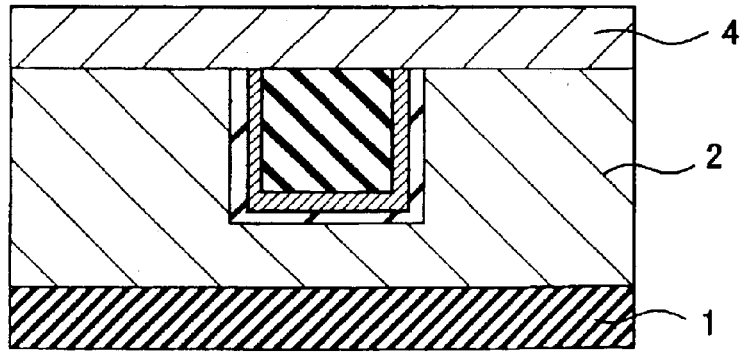

Methods of providing the absorbing layer 7 include a Damascene method, for example, as shown by FIG. 6A to FIG. 6D. First, the interlayer insulating film 2 is formed on the silicon substrate 1 (FIG. 6A), and a wiring pattern groove is formed at the interlayer insulating film 2 by an etching method or the like (FIG. 6B). Further, an absorbing layer 7c, a barrier metal layer 9c and a wiring layer 6c are formed by a processing including electrolytic plating (FIG. 6C); extra portions of the absorbing layer 7c, the barrier metal layer 9c and the wiring layer 6c are removed by a process represented by CMP (Chemical Mechanical Polishing) and the passivation film 4 is then formed (FIG. 6D).

According to the steps shown by FIGS. 6A through 6D, because the absorbing layer 7c is formed before the formation of the barrier metal layer 9, the fuse having a sectional structure shown by FIG. 2 can be realized without newly adding a mask preparing step. The method can also form the wiring 10c at the same stage. Thereby, although the absorbing layer 7 is not required for the wiring inherently, the fuse and the wiring are formed simultaneously by the simplified process.

Further, in order to make the bottom portion 7b of the absorbing layer 7 thinner than the side wall portion 7a, the bottom portion may be removed by using an etching process like RIE (Reactive Ion Etching) at the stage of FIG. 6C. Further, although the barrier metal 9 is shown as a layer different from the absorbing layer 7 in FIG. 2 and FIGS. 6A, 6B, 6C and 6D, the barrier metal layer 9 can be eliminated by forming the absorbing layer 7 with a material which satisfies the condition of the barrier metal layer 9 (for example, TaN and TiN).

Figure 7A:
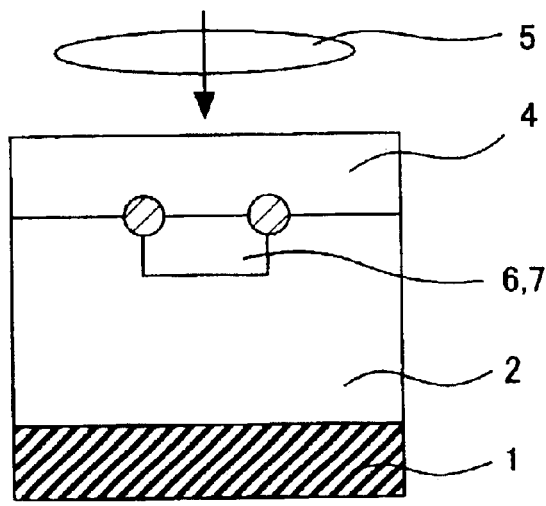
FIGS. 7A and 7B are views for explaining a relationship between a direction of an electric field vector and absorption of energy of a laser beam.
Figure 7B:
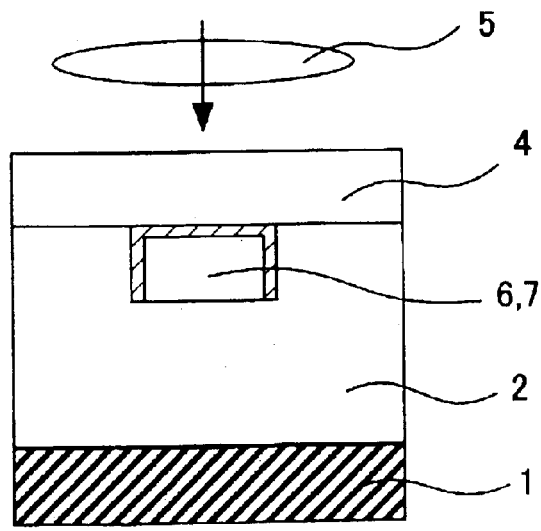

As shown in Japanese Patent Laid-Open No. 297835/1999, an energy absorption distribution of the laser beam incident on the metal member is significantly influenced by a relation between a longitudinal direction of the metal member and a direction of electric field of laser. When laser beam possesses an electric field vector having a component in parallel with the longitudinal direction of the metal member 6, the laser beam is absorbed concentratedly on a surface and an upper edge portion of the metal member 6 (refer to FIG. 7A) On the contrary, when laser beam possesses an electric field vector having a component orthogonal to the longitudinal direction of the metal member, the laser beam is absorbed dispersively on a side face and a lower edge thereof, besides on the surface and the upper edge (refer to FIG. 7B).

Although this fact is little problem when the barrier metal member 9a is disposed at the upper portion of the metal member 3 as shown by FIG. 13B, it is of importance to carry out the laser blow by controlling the electric field vector of the laser beam in a case where the barrier metal layer 9 of the metal member 6 is disposed not on the surface of the fuse but at the side wall portion and the bottom portion thereof. That is to say, in order to blow out the fuse firmly by laser, it is effective to control the electric field vector of the laser beam and to use laser beam for blowing which possesses the electric field vector at least having the component orthogonal to the longitudinal direction of the fuse.

An explanation has been given on the fact that energy can be concentrated effectively on the side wall portion 7a of the absorbing layer 7 by controlling the electric field vector of the laser beam used for blowing the fuse. It is also important to note that in an actual case, the side wall portion 7a of the absorbing layer 7 is not uniformly heated and a distribution of absorption is present as shown by FIG. 8.

Figure 8:
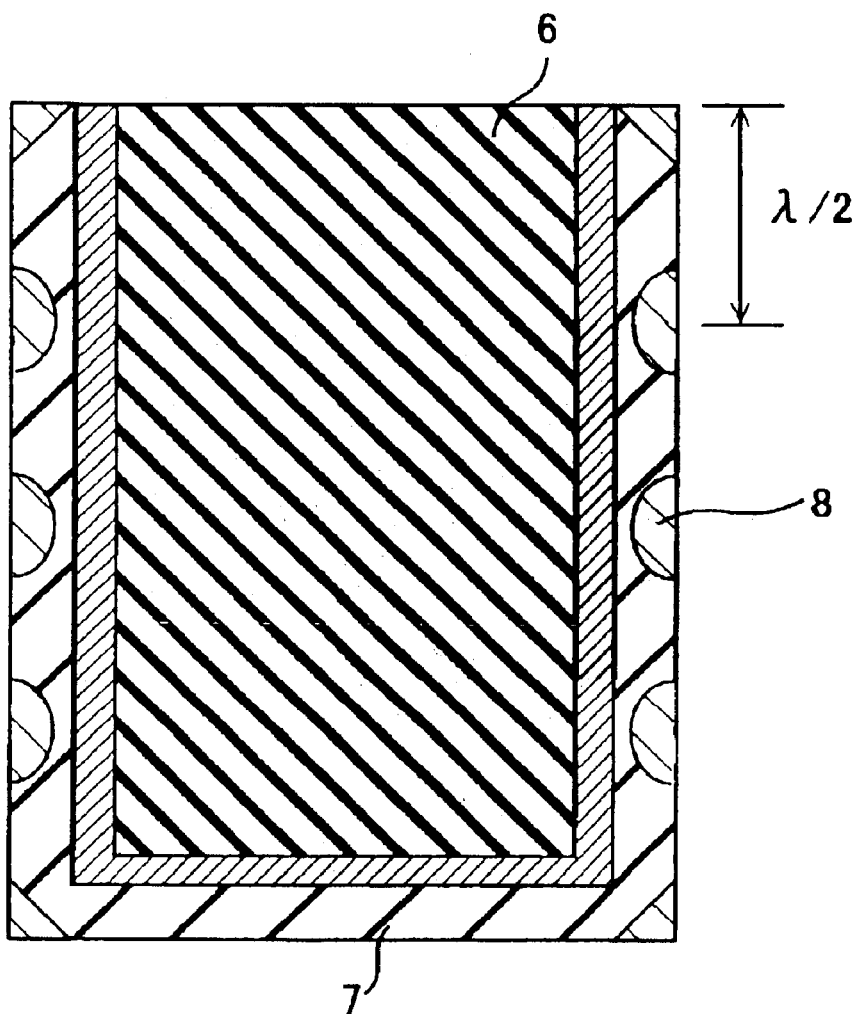
FIG. 8 is a view for explaining an absorption distribution of energy when laser beam is incident on an absorbing layer.
Figure 9:
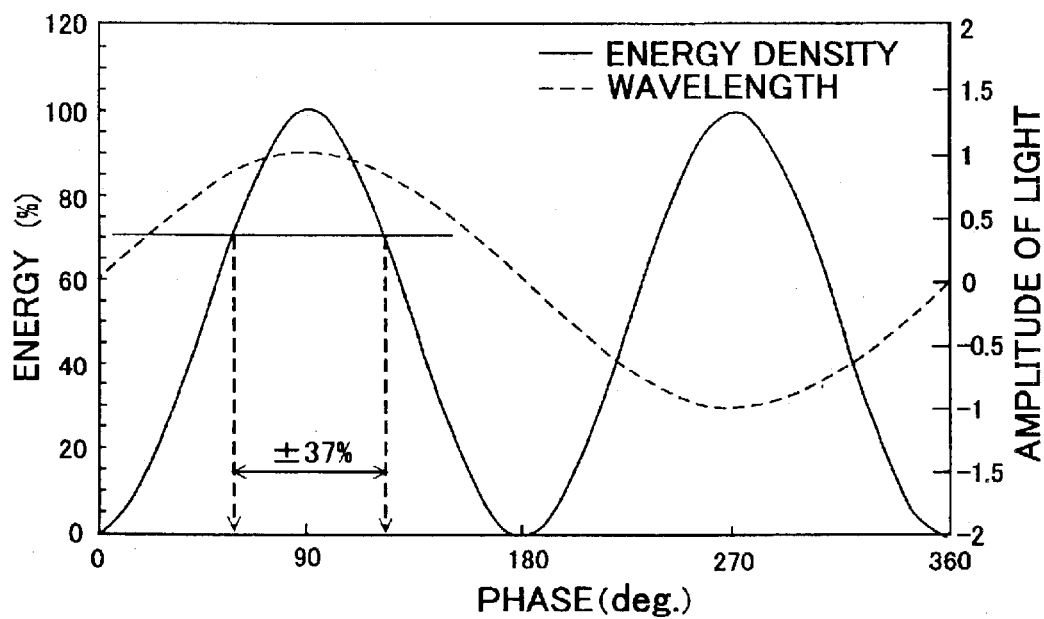
FIG. 9 is a diagram showing a relationship between amplitude and energy of light.

In FIG. 8, a semicircle shows a region 8 where laser beam is absorbed at a high rate. The distribution of the region depends on the wavelength of the laser beam used. The first region of high absorption efficiency is on the upper edge of the fuse and each region lies with a separation of a half-wavelength. As shown by FIG. 9, this corresponds to the fact that the energy density (bold line) of light has peaks which appear periodically at every half-wavelength. In the drawing, a dotted line represents a referential relation between an amplitude and a phase of light.

Therefore, by adjusting a height (depth) of the absorbing layer 7 to a vicinity of the half-wavelength multiplied by an integer, the laser beam can firmly apply its energy to the lower layer portion of the fuse and restrain the occurrence of a cutting residue at the bottom portion of the fuse, even when the metal member 6 becomes thicker in film thickness. As shown in FIG. 9, it is preferable that the height of the absorbing layer 7 falls in a region where the magnitude of energy is not smaller than 70% of the maximum energy, or in other words, using the term of the half-wavelength of the laser beam, a region within ±37% of the half-wavelength.

According to the above discussion, the preferable height (depth) of the absorbing layer 7 falls in the following range:

$$m\lambda/2-0.37(\lambda/2) \sim m\lambda/2+0.37 (\lambda/2),$$

where m is an integer larger than 1 and $\lambda$ is a wavelength of laser. It is noted that the wavelength $\lambda$ is a wavelength in a medium which surrounds the absorbing layer 7. For example, if we use a laser with wavelength of 1.047 $\mu$m, the laser wavelength corresponds to 0.72 $\mu$m in a interlayer insulating film 2 (Refractive Index: 1.45).

Figure 10:
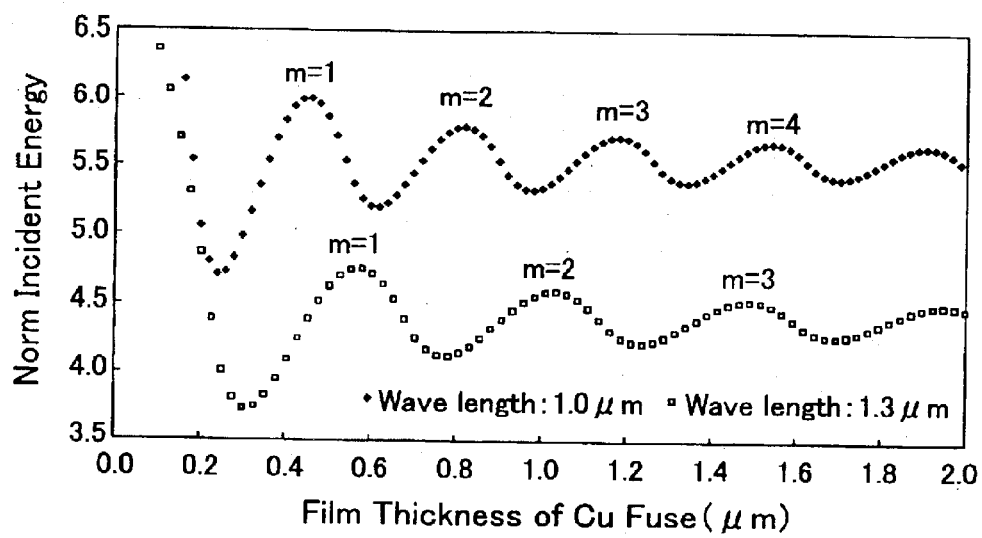
FIG. 10 is a diagram showing a relationship between laser energy absorbed in an absorbing layer and film thickness of a fuse, where the energy is normalized by the film thickness.

When a laser with a constant energy irradiates a copper fuse, laser energy absorbed in an absorbing layer 7 is depicted in FIG. 10, where the energy is normalized with film thickness of the fuse. Laser energy absorbed in unit film thickness changes periodically with the increase of the film thickness. As explained in FIG. 8, peaks in energy absorption appear at an interval of half-wavelength. Energy efficiency in laser absorption gives a rise at the maximum of 10%, if the film thickness of a fuse is designed to fall in the above mentioned range and fuses are irradiated with laser beams of the same energy. Height of the peaks decreases with the increase of integer m (become harder to be blown out).

FIG. 10 also depicts that peak film thickness in energy efficiency depends on the wavelength of lasers. It is clearly shown that a laser of 1.0 $\mu$m in wavelength can blow out fuses of the same film thickness with less energy than a laser of 1.3 $\mu$m in wavelength.

Figure 11:
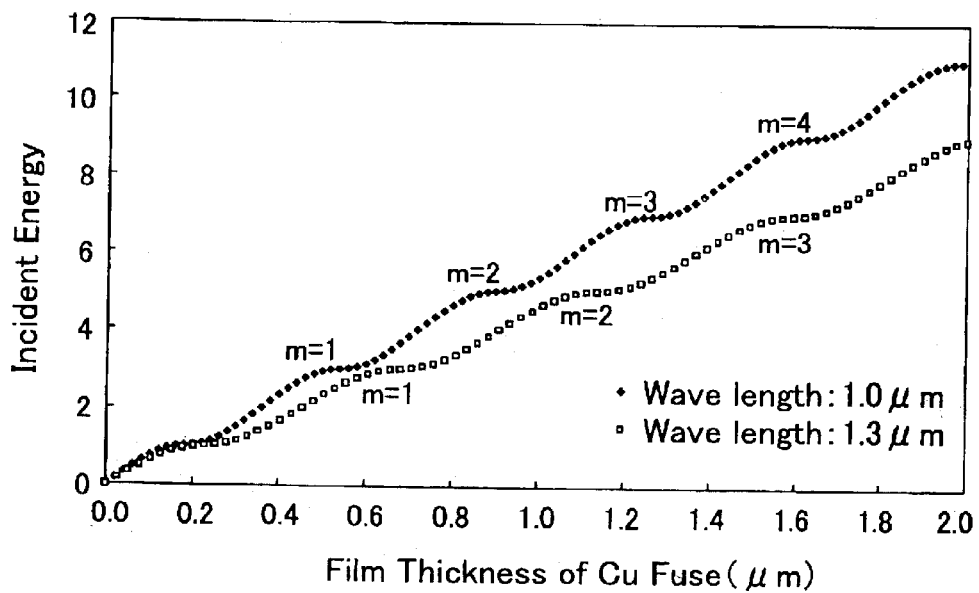
FIG. 11 is a diagram showing a relationship between laser energy absorbed in an absorbing layer and film thickness of a fuse, where the energy is total energy absorbed in an absorbing layer.

FIG. 11 shows the relation between total laser energy absorbed in an absorbing layer and the height of the layer. The figure teaches us that a larger integer m results in an increased total energy absorbed in an absorbing layer 7. Since a lager integer m decreases resistance in a wiring, the integer m of 2 and more are preferable, from the standpoint of decreasing RC delays in signal transmittance. However a larger integer m increases the volume of an absorbing layer 7 and metal member 6 and, moreover, the peaks decrease in height as shown in FIG. 10, laser blowing tends to fail. It is preferable that the integer m is three or less for securing stable laser blowing. Taking into account both the low-resistance wiring and stable laser blowing, the most preferable integer m is 2 or 3. If more film thickness is desired in wiring layers, it is possible to make the films in a fuse region with a less thickness than the films in a wiring region of the same layer level, on the above conditions, in order to pursue the security of stable laser blowing.

Two kind of wirings are on a chip, one is global wiring. disposed on the top layer of the chip for connecting block circuits like analog circuits and memory circuits; the other is local wiring for connecting elements. Scaling is performed in local wiring to reduce RC delays for operating a chip with a higher frequency. However, because simple shrink in global wiring increases total area of a chip, the wiring will be higher in resistance and increase RC delays in an advanced generation.

Thus, to achieve a lower resistance in a global wiring is an urgent issue of importance for operational speed up of VLSIs.

One method of decreasing the resistance in a global wiring is to expand the cross section of the wiring. If of the wiring in cross section is pursued with holding a certain degree of density in ULSI circuits, film thickness of the wiring increases. The global wiring would be 1.0 $\mu$m or more in film thickness, even if a chip expansion rate is restrained at 0%. According to the present invention, fuses in such a thick global wiring can be blown out.

Figure 12:
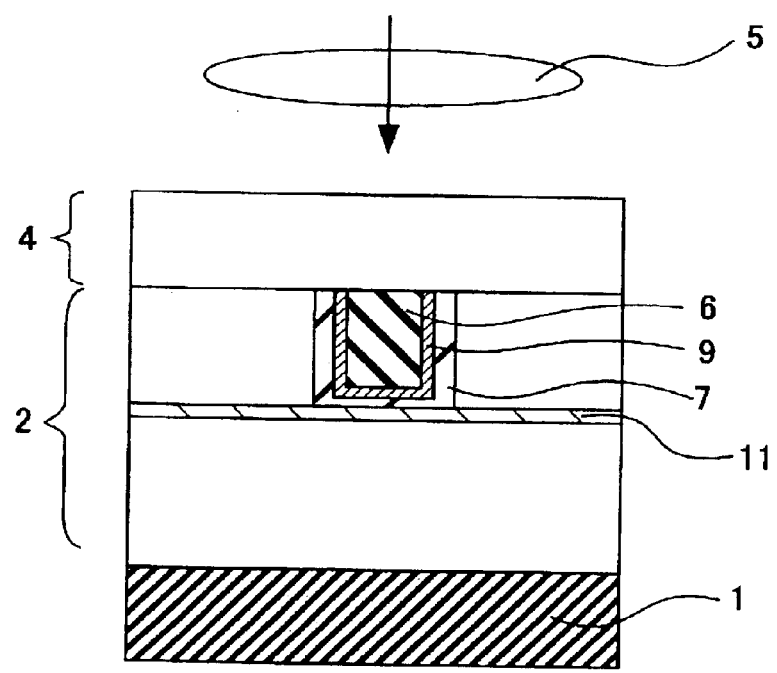
FIG. 12 is a view for explaining a semiconductor integrated circuit provided with a high refractive index layer below a fuse.

Further, as shown in FIG. 12, a high refractive index layer 11 having a refractive index higher than that of the passivation film 4 (SiN film, SiON film or the like when the passivation film 4 is comprised of silicon oxide, for example) may be formed at the bottom of the fuse. The high refractive index layer 11 doesn't need to be in contact with the bottom portion 7b of the absorbing layer 7 (or a bottom layer of the barrier metal layer 9 when the bottom portion 7b is not present) A portion of the laser beam irradiated for laser blowing is reflected at the passivation film 4 and is incident again on the metal member 6 and the absorbing layer 7, which increases an efficiency of energy utilization. As a result, laser blowing can be carried with little influence on the silicon substrate 1 and a peripheral portion of the contiguous fuses.

What is claimed is:

1. A semiconductor integrated circuit comprising:
    a wiring member formed on a main face of a semiconductor substrate;
    a fusing member connected to the wiring member and having a predetermined thickness;
    a light absorbing member for covering a bottom face and a side face of the fusing member; and
    an insulating member for embedding the wiring member, the fusing member and the light absorbing member therein;
    wherein a complex permittivity of the light absorbing member is provided with a real part smaller than that of the fusing member in absolute value and an imaginary part larger than that of the fusing member.

2. The semiconductor integrated circuit according to claim 1:
    wherein the wiring member includes a light absorbing member for covering a bottom face and a side face thereof, as the fusing member does.

3. The semiconductor integrated circuit according to claim 1:
    wherein the fusing member is comprised of metal whose major constituent is copper.

4. The semiconductor integrated circuit according to claim 1:
    wherein the light absorbing member is comprised of tantalum nitride or titanium nitride.

5. The semiconductor integrated circuit according to claim 1:
    wherein the fusing member is thinner than the wiring member in film thickness formed at the same stage as that of the fusing member.

6. A semiconductor integrated circuit comprising:
    a wiring member formed on a main face of a semiconductor substrate;
    a fusing member connected to the wiring member and having a predetermined thickness;
    a barrier member for covering a bottom face and a side face of the fusing member;
    a light absorbing member for covering at least a side face portion of the barrier member for covering the fusing member; and
    an insulating member for embedding the wiring member, the fusing member, the barrier member and the light absorbing member therein;
    wherein a complex permittivity of the light absorbing member is provided with a real part smaller than that of the fusing member in absolute value and an imaginary part larger than that of the fusing member.

7. The semiconductor integrated circuit according to claim 6:
    wherein the wiring member includes a barrier member for covering a bottom face and a side face thereof and a light absorbing member for covering at least a side face portion of the barrier member, as the fusing member does.

8. The semiconductor integrated circuit according to claim 6:
    wherein the fusing member is comprised of metal whose major constituent is copper.

9. The semiconductor integrated circuit according to claim 6:
    wherein the light absorbing member includes tantalum nitride, tungsten nitride or titanium nitride.

10. The semiconductor integrated circuit according to claim 6:

wherein a thickness of the light absorbing member is 50% or above and 300% or below of a thickness of the fusing member where light for blowing out shows an maximum absorption efficiency.

11. The semiconductor integrated circuit according to claim 6:

wherein a height of the light absorbing member is a half-wavelength of light used for blowing the fusing member multiplied by an integer, plus or minus 37% of the half-wavelength.

12. The semiconductor integrated circuit according to claim 11:

wherein the integer for multiplying a half-wavelength of light is 2 or 3.

13. The semiconductor integrated circuit according to claim 6:

wherein the insulating member includes a first insulating film embedding the fusing member as high as the top face thereof, and a second insulating film for covering the first insulating film.

14. The semiconductor integrated circuit according to claim 13:

wherein a reflecting film layer having a higher refractive index than the second insulating film is formed between the main face and a bottom face of the fusing member.

15. The semiconductor integrated circuit according to claim 6:

wherein the barrier member is comprised of tantalum nitride or titanium nitride.

16. The semiconductor integrated circuit according to claim 6:

wherein the fusing member is thinner than the wiring member in film thickness which is formed at the same stage that the fusing member is formed.

* * * * *